United States Patent
Lee (10) Patent No.: US 8,497,434 B2
(45) Date of Patent: Jul. 30, 2013

(54) PRINTED CIRCUIT BOARD AND MANUFACTURING METHOD THEREOF

(75) Inventor: Jae-Seok Lee, Cheongjoo-si (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 385 days.

(21) Appl. No.: 12/651,191

(22) Filed: Dec. 31, 2009

(65) Prior Publication Data

US 2011/0088930 A1    Apr. 21, 2011

(30) Foreign Application Priority Data

Oct. 19, 2009   (KR) .................... 10-2009-0099217

(51) Int. Cl.
*H05K 1/11* (2006.01)

(52) U.S. Cl.
USPC ............ 174/264; 174/263; 174/256; 174/257

(58) Field of Classification Search
USPC .................... 174/256, 257, 263, 264
See application file for complete search history.

(56) References Cited

U.S. PATENT DOCUMENTS

| | | | |
|---|---|---|---|
| 2004/0078969 A1* | 4/2004 | Kanzawa et al. | 29/852 |
| 2006/0284640 A1* | 12/2006 | Wang et al. | 324/765 |
| 2008/0196934 A1* | 8/2008 | Chen et al. | 174/262 |
| 2008/0223610 A1* | 9/2008 | Choi et al. | 174/261 |

FOREIGN PATENT DOCUMENTS

CN    101175378 A    5/2008

OTHER PUBLICATIONS

English translation of the Chinese Office Action issued in Chinese Patent Application No. 200910265769.5 dated Jun. 5, 2012.
Office Action issued in Chinese Patent Application No. 200910265769.5 dated Mar. 1, 2013.

* cited by examiner

*Primary Examiner* — Tuan T Dinh
*Assistant Examiner* — Steven Sawyer
(74) *Attorney, Agent, or Firm* — McDermott Will & Emery LLP (57) ABSTRACT

A printed circuit board and a manufacturing method of the same are disclosed. The method includes: preparing a carrier including a primer resin layer formed thereon; forming a circuit pattern on the primer resin layer; stacking the carrier onto an insulating layer such that the circuit pattern is buried in the insulating layer; removing the carrier; forming a via hole in the insulating layer on which the primer resin layer is stacked; and forming a conductive via in the via hole. The conductive via is formed by forming a plating layer in the via hole and on the primer resin layer and removing a portion of the plating layer formed over the primer resin layer.

1 Claim, 15 Drawing Sheets

PRINTED CIRCUIT BOARD AND MANUFACTURING METHOD THEREOF

CROSS-REFERENCE TO RELATED APPLICATIONS

This application claims the benefit of Korean Patent Application No. 10-2009-0099217, filed with the Korean Intellectual Property Office on Oct. 19, 2009, the disclosure of which is incorporated herein by reference in its entirety.

BACKGROUND

1. Technical Field

The present invention relates to a printed circuit board and a manufacturing method thereof.

2. Description of the Related Art

With the recent trend for a high density multi-functional package board having an electro-device, there has been an increasing demand for high density circuit patterns that are formed on a substrate.

According to the related art, circuit patterns are formed on the surface of an insulating layer. However, since the structure is not suitable for high density circuit patterns, a technique of burying circuit patterns in the insulating layer has been introduced. According to the technique, a carrier is prepared, and a circuit pattern is formed over the carrier. And then, the circuit pattern is transferred to an insulating resin.

Here, since a metal barrier is interposed between the carrier and the circuit pattern, there is a limit to simplification of manufacturing processes because the metal barrier has to be etched while the circuit pattern is transferred to the insulating resin. In addition, when a hole is processed in the insulating resin in order to form a via for interlayer connection, a portion of the metal barrier has to be opened, before the hole is processed. In that case, an interlayer accuracy may be deteriorated due to the process of opening a portion of the metal barrier.

SUMMARY

An aspect of the present invention provides a method of manufacturing a printed circuit board, which can include: preparing a carrier including a primer resin layer formed thereon; forming a circuit pattern on the primer resin layer; stacking the carrier onto an insulating layer such that the circuit pattern is buried in the insulating layer; removing the carrier; forming a via hole in the insulating layer on which the primer resin layer is stacked; and forming a conductive via in the via hole. The conductive via can be formed by forming a plating layer in the via hole and on the primer resin layer and removing a portion of the plating layer formed over the primer resin layer.

The carrier can be made of metal, and the via hole can be a blind via hole (BVH).

The via hole can be formed by performing a laser processing from a direction of the primer resin layer.

Another aspect of the present invention provides a printed circuit board. The printed circuit board can include: an insulating layer including circuit patterns buried in both sides of the insulating layer; a via electrically connecting the both sides of the insulating layer; a primer resin layer stacked over one side of the insulating layer; and a solder-resist layer covering the primer resin layer.

The via hole can be a blind via hole (BVH).

DETAILED DESCRIPTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed description of related art is omitted when it is deemed that it may unnecessarily obscure the essence of the invention.

A printed circuit board and a manufacturing method thereof according to certain embodiments of the present invention will be described below in more detail with reference to the accompanying drawings. Those components that are the same or are in correspondence are rendered the same reference numeral regardless of the figure number, and redundant descriptions are omitted.

Figure 1:
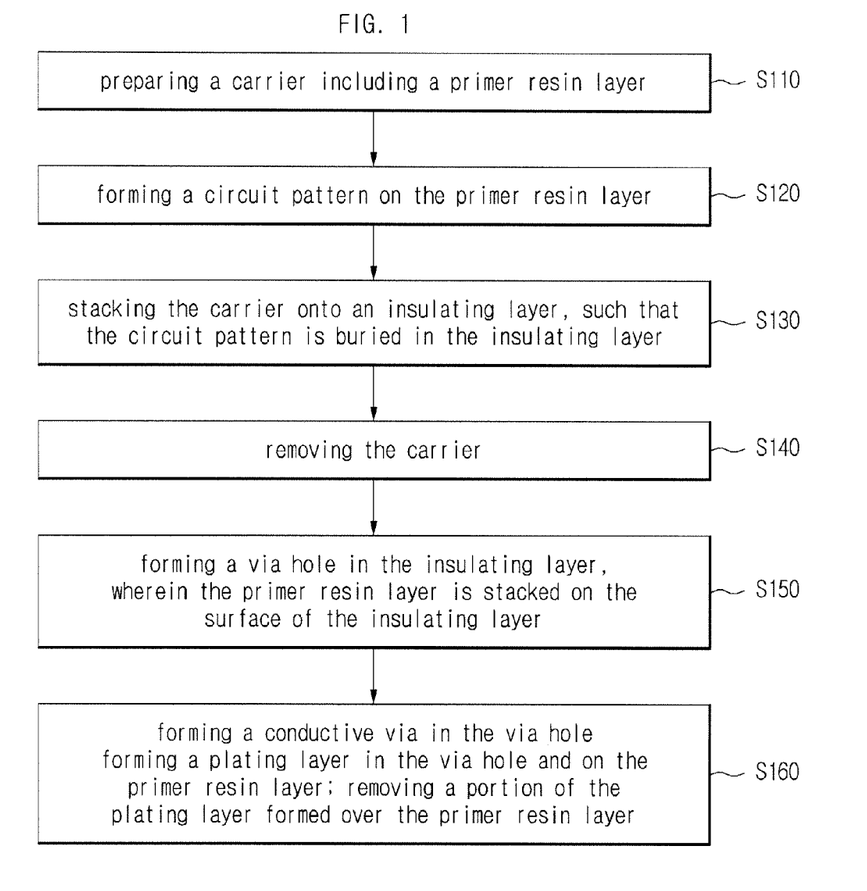
FIG. 1 is a flowchart illustrating a method of manufacturing a printed circuit board according to an embodiment of the invention.

FIG. 1 is a flowchart illustrating a method of manufacturing a printed circuit board according to an embodiment of the invention, and FIGS. 2 to 14 illustrate processes for a method of manufacturing a printed circuit board according to an embodiment of the invention. Illustrated in FIGS. 2 to 14 are a supporting member 10, a carrier 20, a primer resin layer 30, a metal foil 40, a plating resist 42, circuit patterns 44, 62, an insulating layer 50, a via hole 52, plated metal 56, a conductive via 58 and an inner substrate 60.

Figure 2:
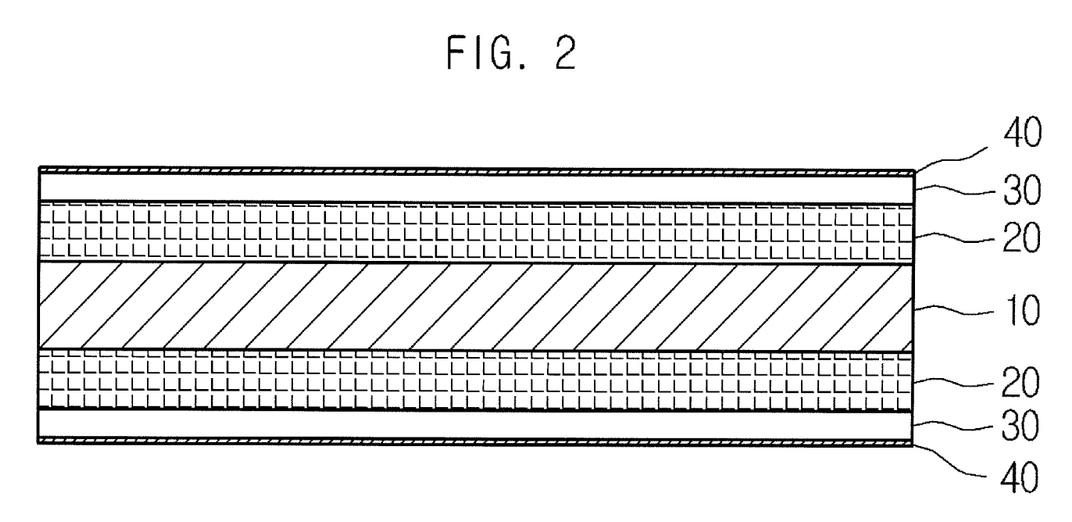
FIGS. 2 to 14 illustrate processes for a method of manufacturing a printed circuit board according to an embodiment of the invention.

First, a carrier 20 including a primer resin layer 30 is prepared (S110), and a circuit pattern 44 is formed on the primer resin layer 30 (S120). For that, as shown in FIG. 2, a structure includes, in the successive order of carriers 20, primer resin layers 30 and metal foils 40 on both sides of a supporting member 10. Here, the supporting member 10 may be made of, for example, a thermoplastic material whose adhesion can be reduced when the supporting member 10 is heated. The carriers 20 stacked on both sides of the supporting member 10 are to be separated from the supporting member 10 later. The metal foil 40 may be made of copper or other conductive metal.

Figure 3:
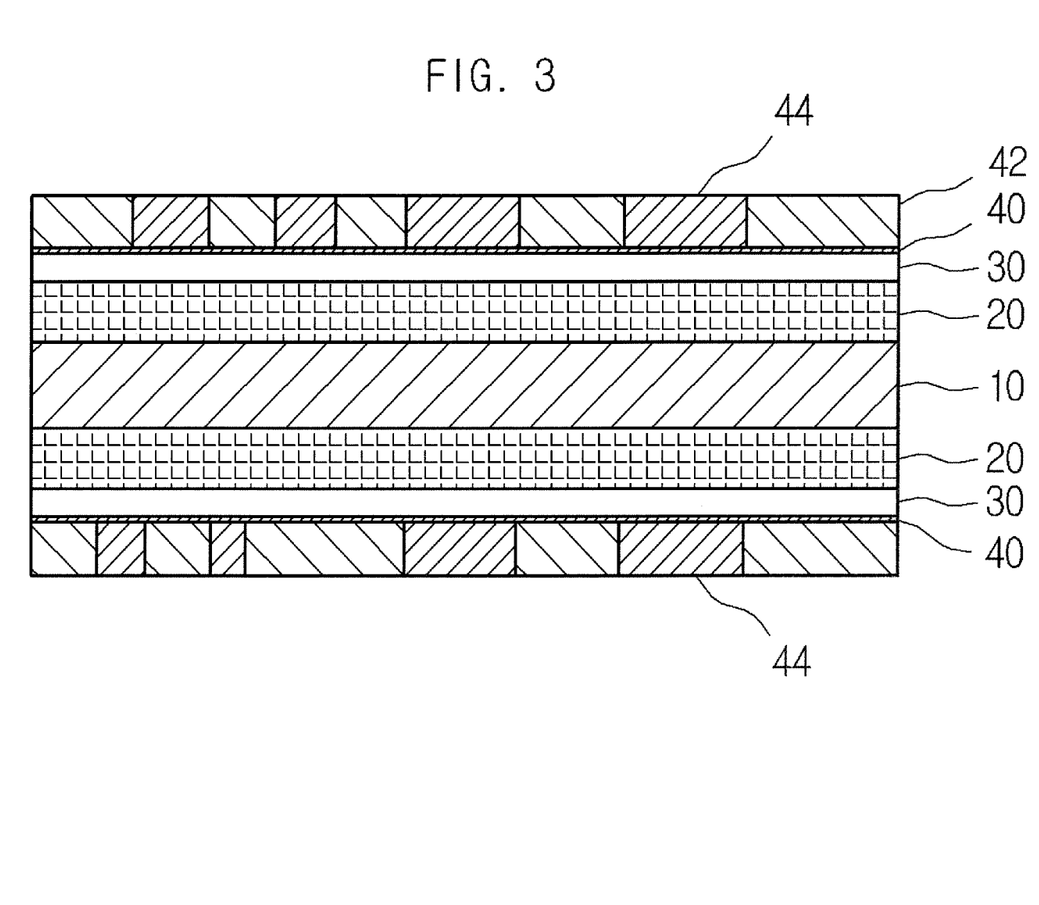
Figure 4:
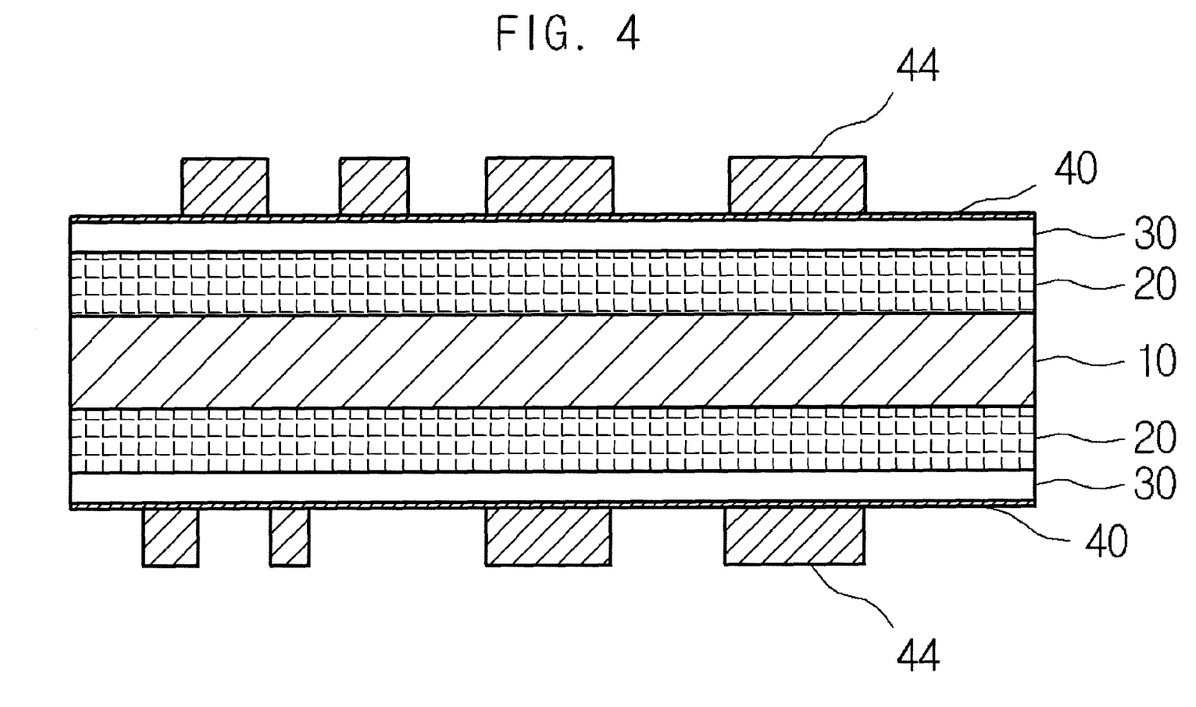

Next, as shown in FIG. 3, a patterned plating resist 42 is formed over the metal foil 40, and a circuit pattern 44 is formed by an electro-plating process. Here, since the metal foil 40 formed over the primer resin layer 30 can serve as a seed layer, the electro-plating process for forming the circuit pattern 44 can be carried out. Then the plating resist 42 is removed, and a circuit pattern 44 is formed on the metal foil 40 such that the circuit pattern 44 has a protruding shape.

Figure 5:
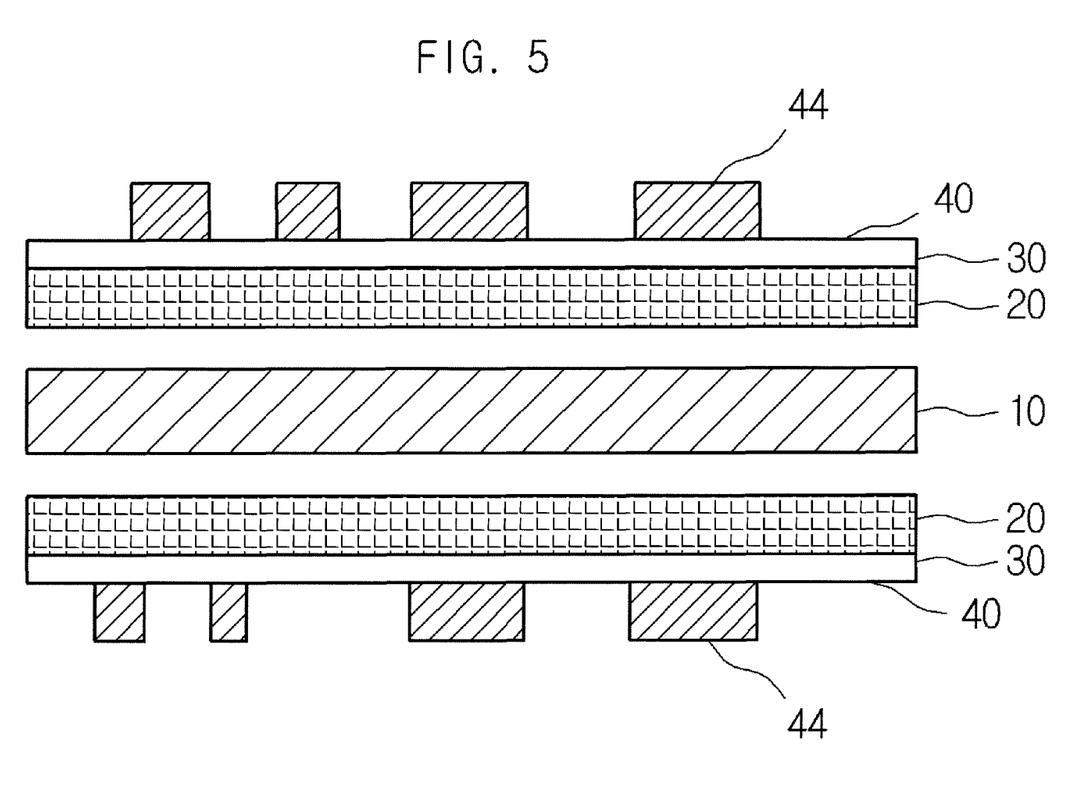

Next, as shown in FIG. 5, the carriers 20 stacked on the supporting member 10 are separated from the supporting member 10. Before that, a surface-treatment process may be carried out on the circuit pattern 44 such that enough adhesion between the circuit pattern 44 and the insulating layer 50 can be ensured. When the surface-treatment process is carried out by flash etching etc., a roughness may be formed on the surface of the circuit pattern 44 and the adhesion between the circuit pattern 44 and the insulating layer 50 can be increased. During this process, the exposed portions of the metal foil 40 on the primer resin layer 30 may be removed.

Figure 6:
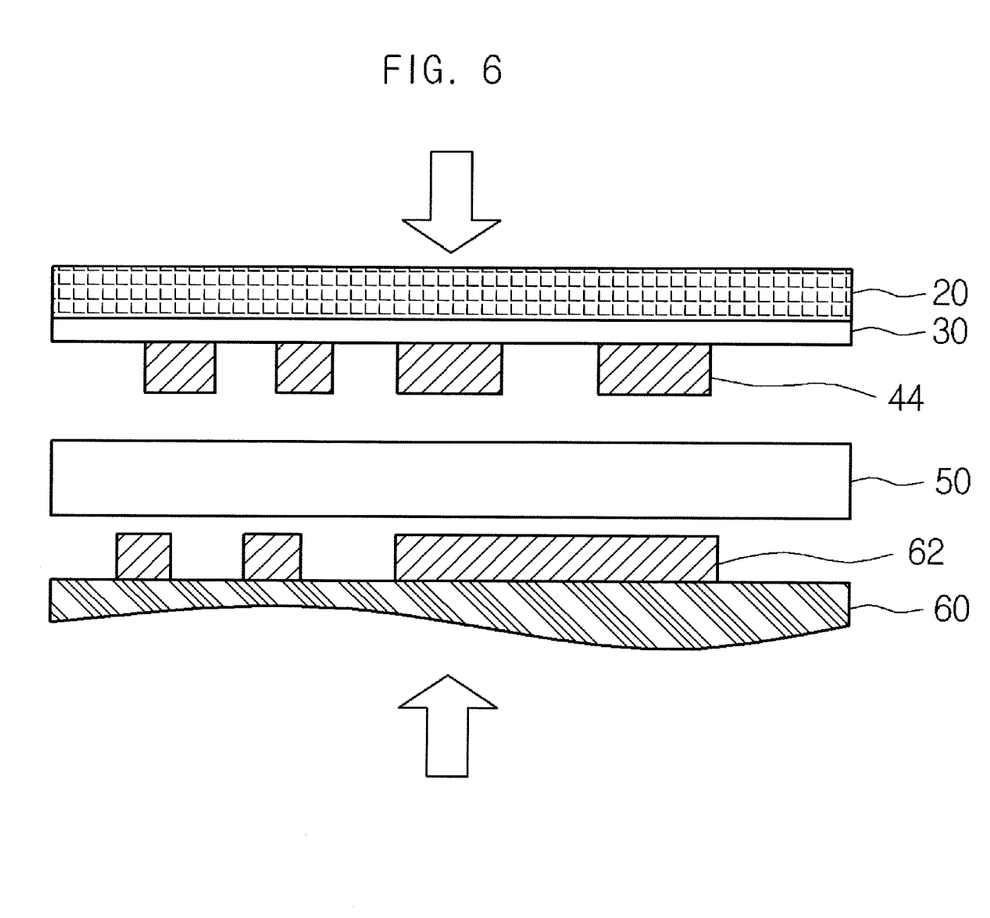
Figure 7:
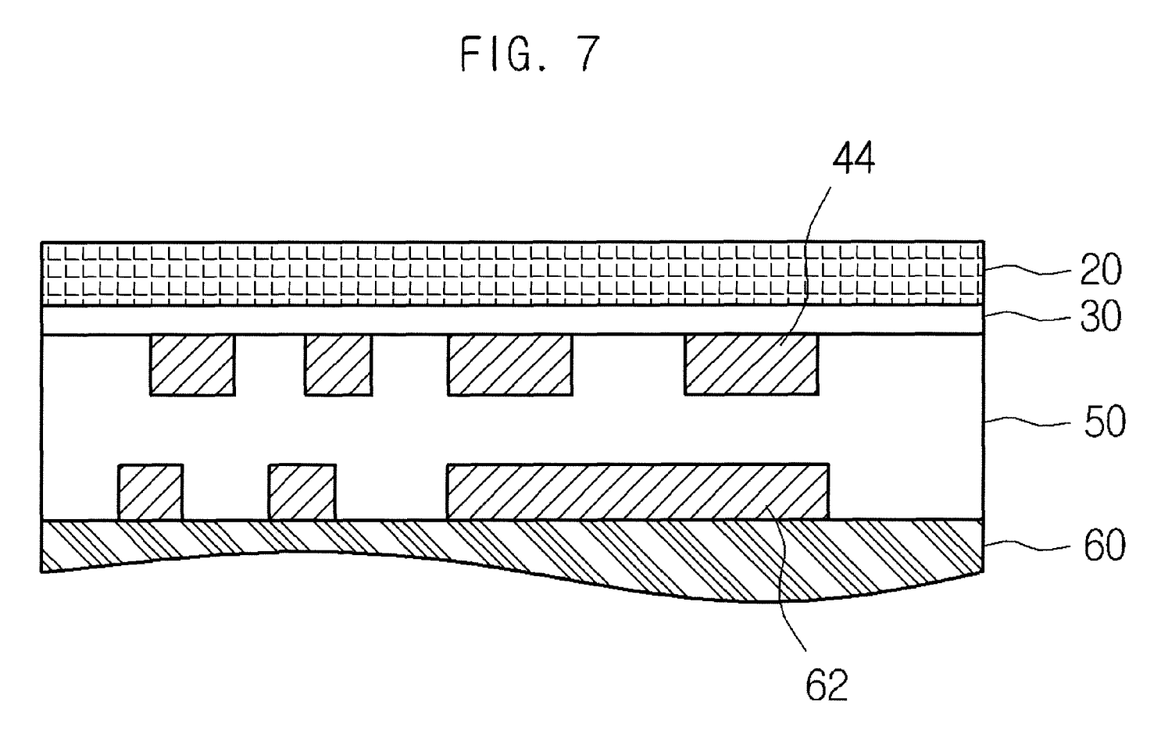

Then, as shown in FIGS. 6 and 7, the carrier 20 is stacked onto an insulating layer 50 and the circuit pattern 44 is buried in the insulating layer 50 (S130). Since the primer resin layer 30 and circuit pattern 44 are formed on the surface of the carrier 20, the circuit pattern 44 can be buried in the insulating layer 50 when the carrier 20 is stacked on the insulating layer 50. Here, the insulating layer 50 may be in B-stage, that is, semi-hardened. In that case, the circuit pattern 44 may be buried in the insulating layer 50 easily. And then, the solid bonding strength between the circuit pattern 44 and the insulating layer 50 may be obtained when the insulating layer 50 is hardened.

Meanwhile, as shown in FIG. 6, an inner substrate 62 may be stacked on the lower surface of the insulating layer 50. A circuit pattern 62 may be formed on the surface of the inner substrate 62, and buried in the insulating layer 50 by stacking each other.

Figure 15:
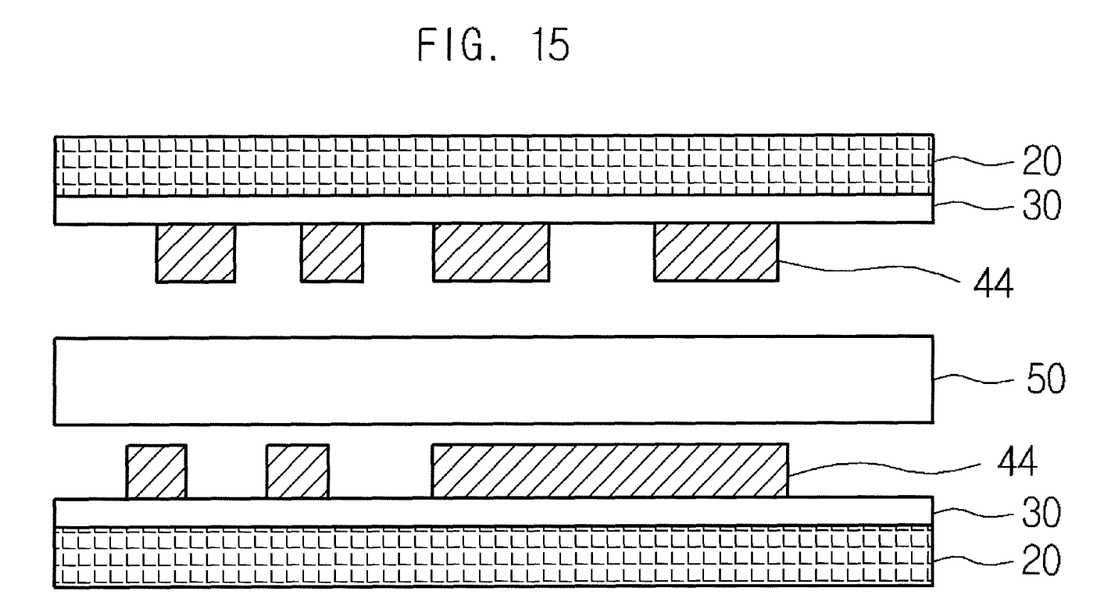
FIG. 15 illustrates a process that two carriers are compressed on upper and lower sides of the insulating layer, respectively.

When a 2-layers substrate is needed, two carriers 20 separated from the supporting member 10 may be compressed on upper and lower sides of the insulating layer 50, respectively, as shown in FIG. 15. In that case, circuit patterns 44 may be buried in both sides of the insulating layer 50 at the same time in one process.

Figure 8:
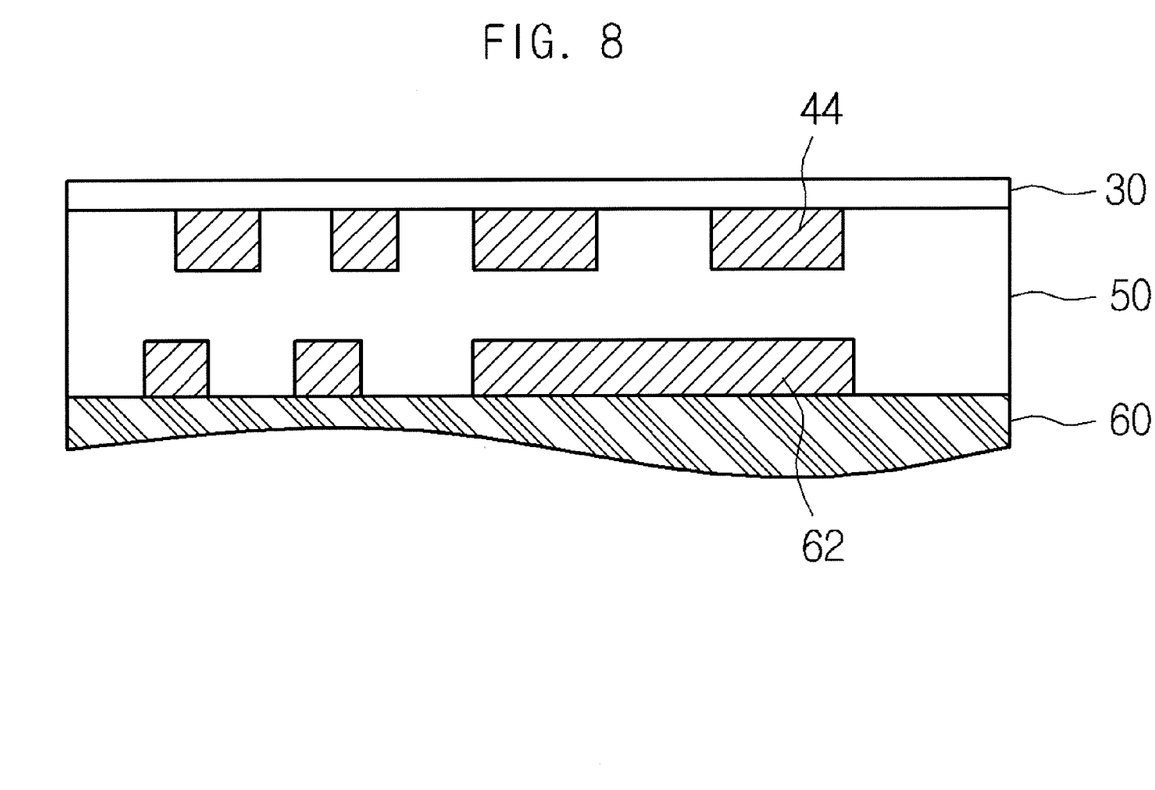

Next, as shown in FIG. 8, the carrier 20 is removed (S140). When the carrier 20 is made of metal, the carrier 20 may be removed by a wet-etching process with etchant. In that case, since the upper surface of the circuit pattern 44 buried in the insulating layer 50 is covered by the primer resin layer 30, the circuit pattern 44 may not be damaged by the etchant used for removing the carrier 20.

Figure 9:
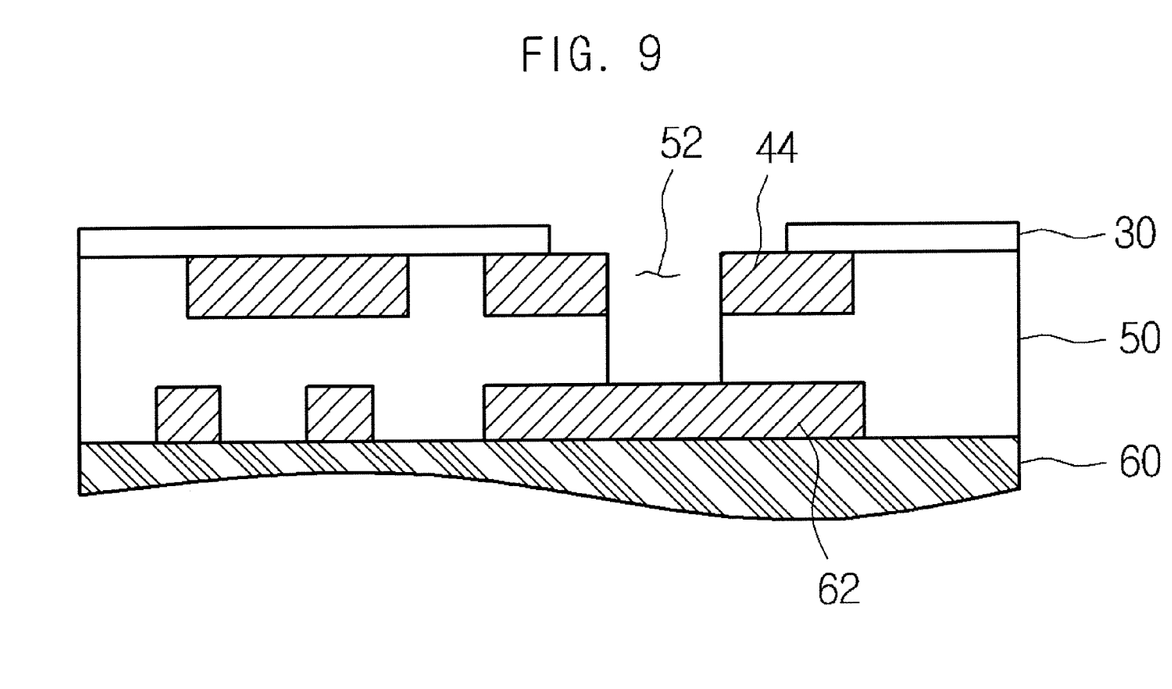

Next, as shown in FIG. 9, a via hole 52 is processed (S150). A laser may be used for processing the via hole 52. In this embodiment, since the circuit pattern 44 is covered by the primer resin layer 30, the via hole 52 may be processed directly without processing a window. Also, when a lower side of the via hole 52 is covered by a circuit pattern 62 formed on the inner substrate 60, that is, the via hole 52 is a blind via hole (BVH), a depth of the via bole 52 may be controlled easily.

Next, a via 85 for interlayer connection is formed in the via hole 52 (S160). A brief description is set forth below.

Figure 10:
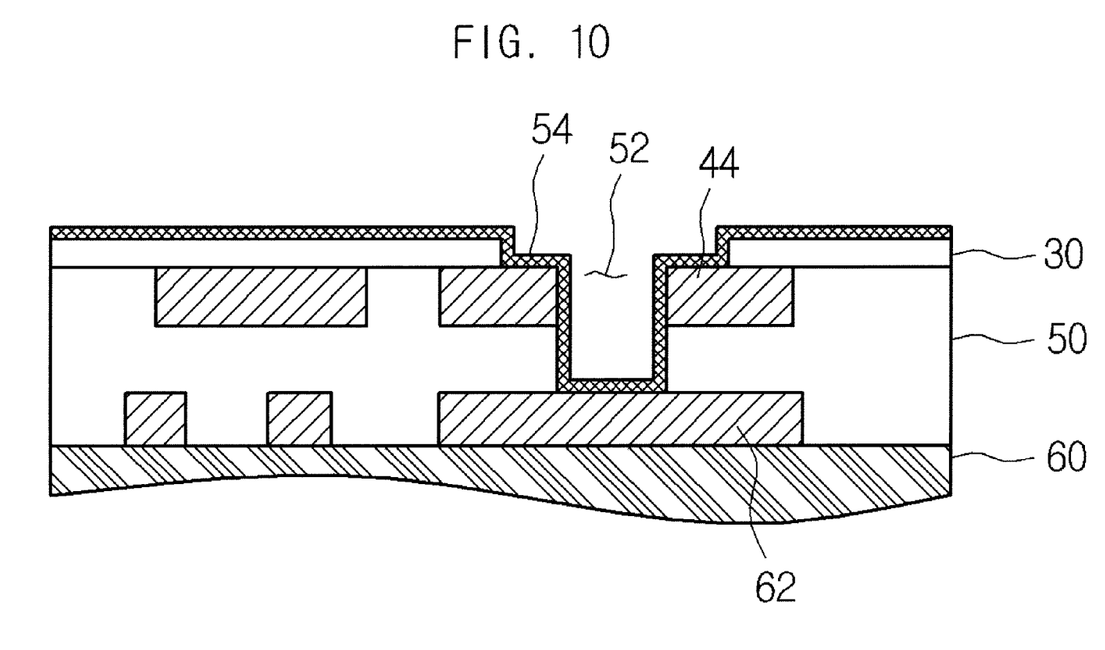

First, as shown in FIG. 10, a seed layer 54 is formed on the primer resin layer 30 and inner wall of the via hole 52. For that, an electroless plating process may be carried out.

Figure 11:
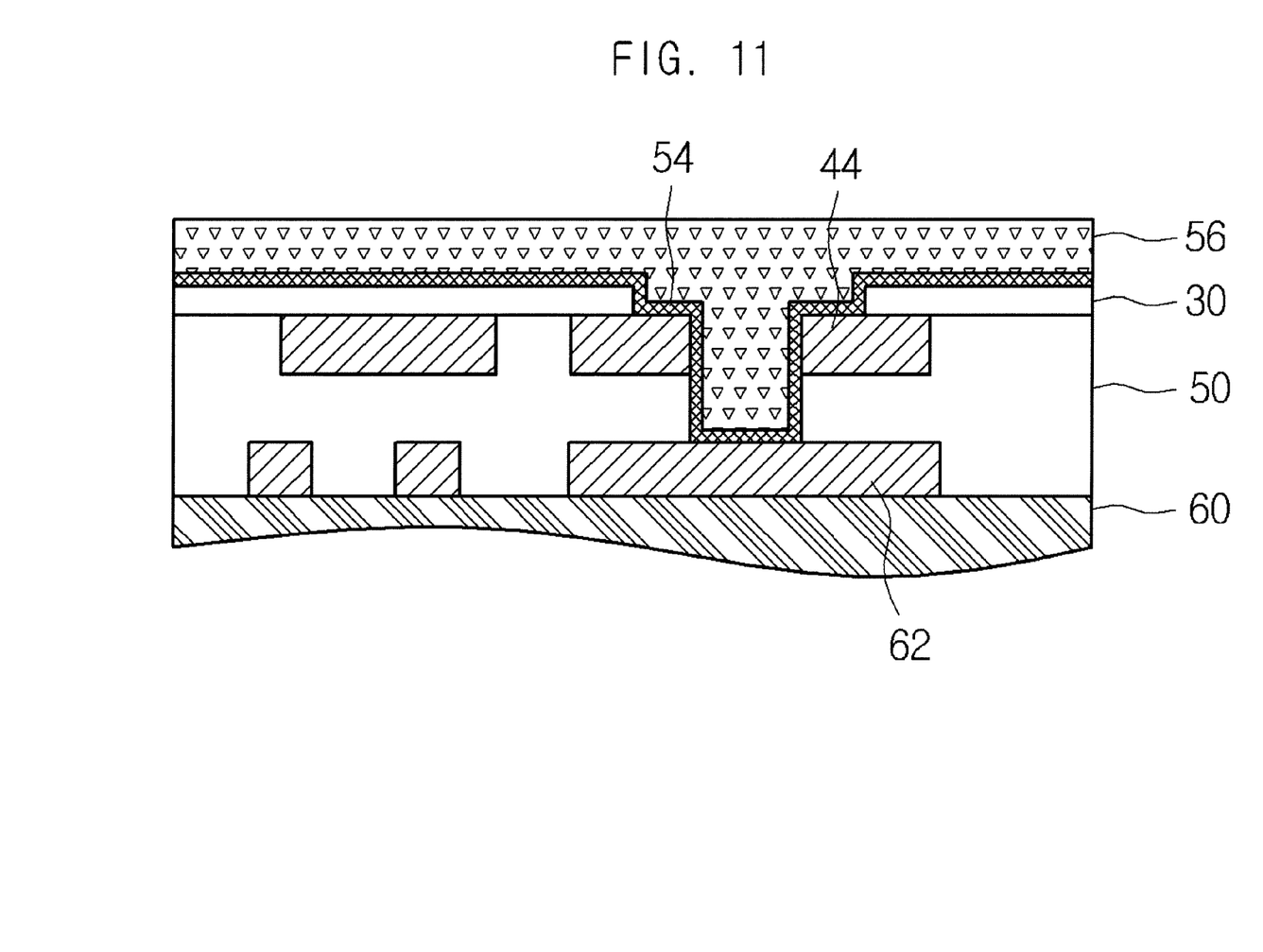

Then, plated metal 52 is filled in the via hole 52 by an electro-plating process, as shown in FIG. 11. The plated metal 52 filled in the via hole 52 can serve as a conductive via 58 for interlayer connection. The plated metal 52 may be copper (Cu) or whatever is suitable for transmitting electric signals.

Figure 12:
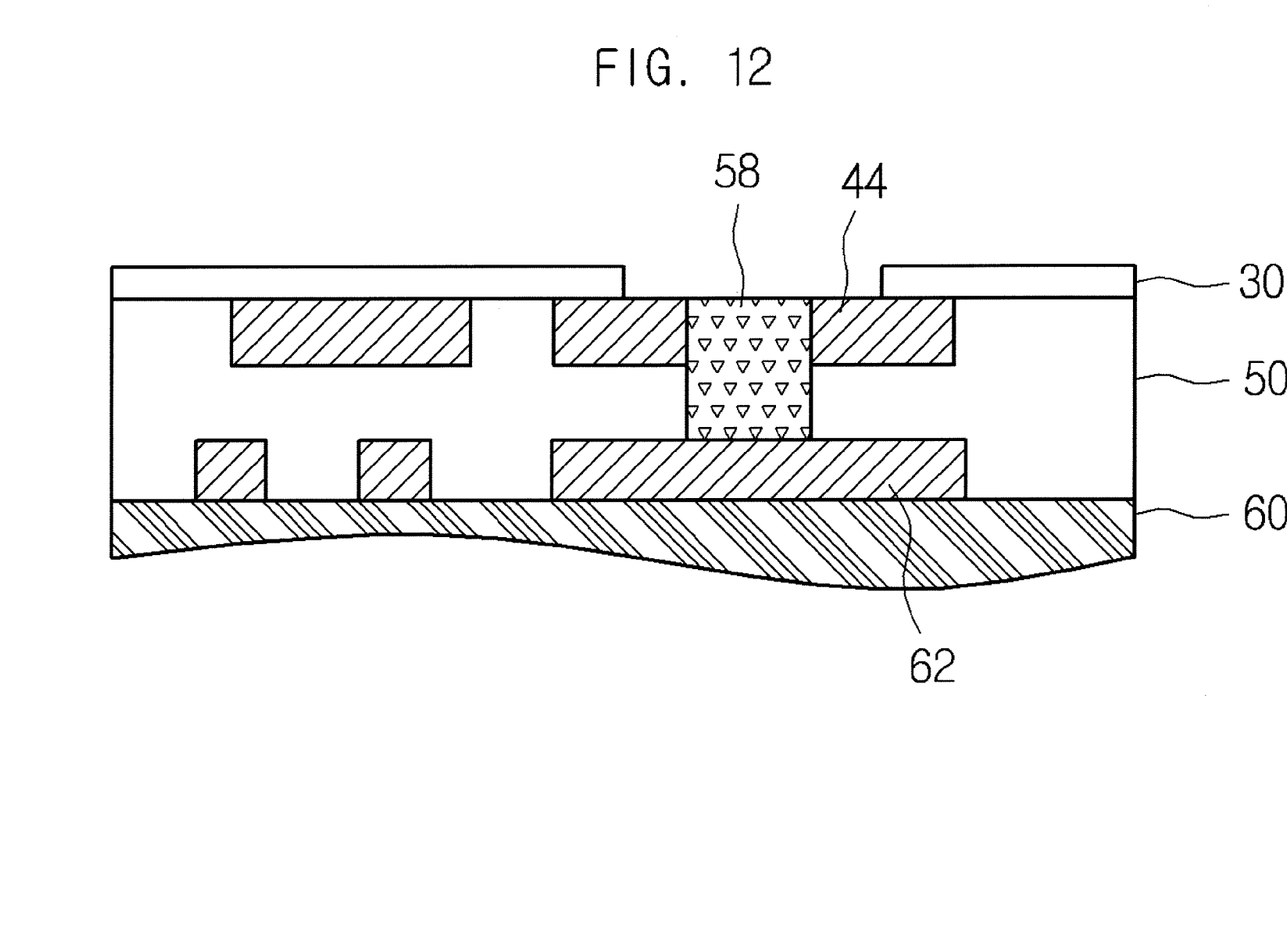

Next, as shown in FIG. 12, a portion of the plated metal 52 formed over the primer resin layer 30 is removed. For that, a wet-etching process with an etchant may be carried out. In that case, the primer resin layer 30 formed on the surface of the insulating layer 50 can serve as an etch-stop barrier.

Figure 13:
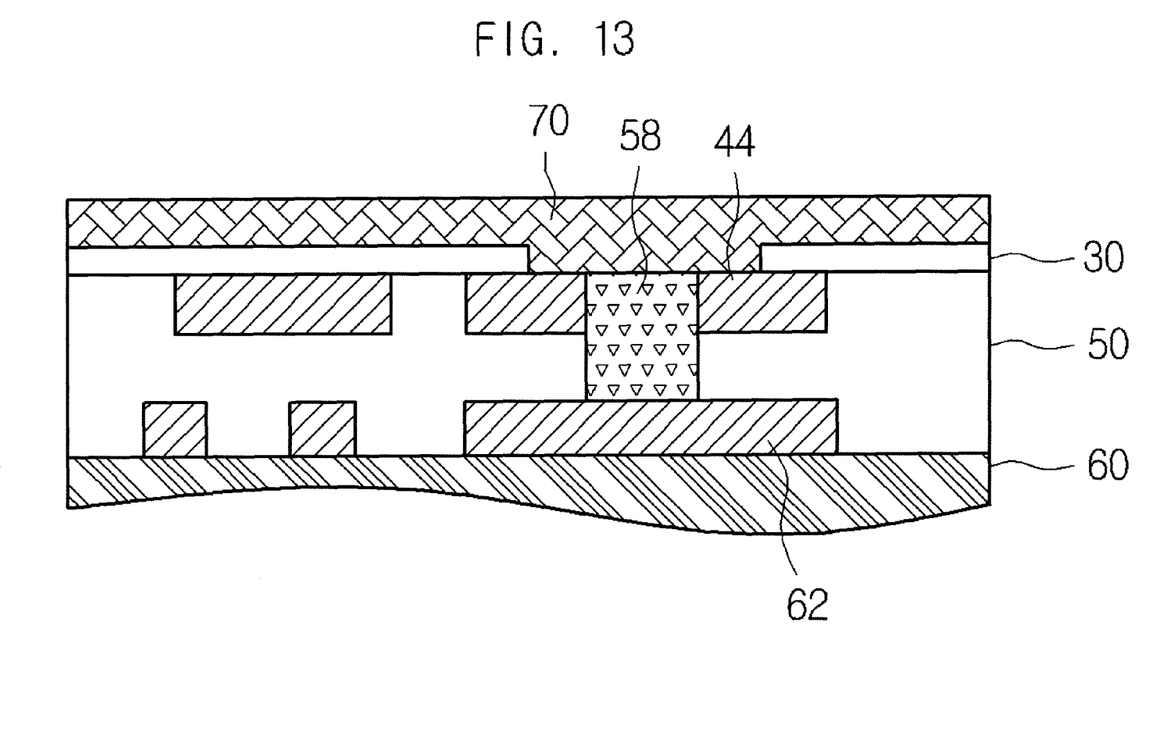

And, as shown in FIG. 13, a solder resist layer 70 is formed by dispensing solder resist ink while the primer resin layer 30 remains.

Figure 14:
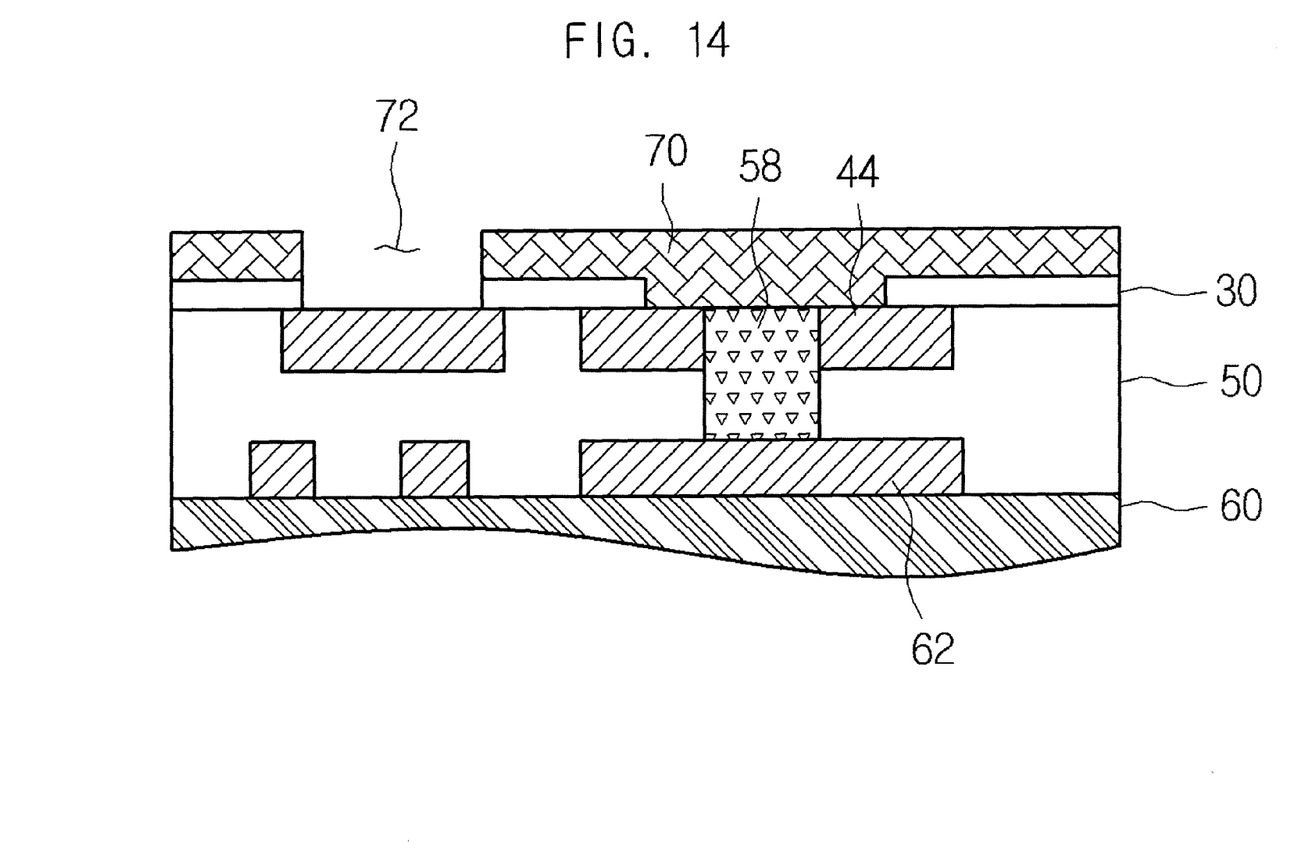

A printed circuit board manufactured by the processes set forth above is illustrated in FIG. 14. With reference to FIG. 14, a printed circuit board according to this embodiment includes: an insulating layer 50, circuit patterns buried in both sides of the insulating layer 50; a conductive via 58 electrically connecting the both sides of the insulating layer 50; a primer resin layer 30 stacked over one side of the insulating layer 50; and a solder-resist layer covering the primer resin layer 30.

While the spirit of the present invention has been described in detail with reference to particular embodiments, the embodiments are for illustrative purposes only and shall not limit the present invention. It is to be appreciated that those skilled in the art can change or modify the embodiments without departing from the scope and spirit of the present invention.

As such, many embodiments other than those set forth above can be found in the appended claims.

What is claimed is:

1. A printed circuit board comprising:
   an insulating layer including a first surface and a second surface;
   a first circuit pattern and a second circuit pattern, the first circuit pattern and the second circuit pattern being buried in the first surface and the second surface of the insulating layer, respectively;
   a blind via, electrically connecting the first surface and the second surface by penetrating through the insulating layer, wherein an upper surface of the blind via and an upper surface of the first circuit pattern are placed on a same planar surface;
   a primer resin layer, stacked over the first surface of the insulating layer such that a portion of the upper surface of the first circuit pattern and the upper surface of the blind via are exposed; and
   a solder-resist layer, covering the primer resin layer, the first circuit pattern, and the blind via, wherein the solder-resist layer exposes a portion of the upper surface of the first circuit pattern,
   wherein the primer resin layer formed on the first surface of the insulating layer exposes the upper surface of the blind via.

* * * * *